United States Patent [19]
Naritake et al.

[11] Patent Number: 5,631,872
[45] Date of Patent: May 20, 1997

[54] LOW POWER CONSUMPTION SEMICONDUCTOR DYNAMIC RANDOM ACCESS MEMORY DEVICE BY REUSING RESIDUAL ELECTRIC CHARGE ON BIT LINE PAIRS

[75] Inventors: Isao Naritake; Tadahiko Sugibayashi; Satoshi Utsugi; Tatsunori Murotani, all of Tokyo, Japan

[73] Assignee: NEC Corporation, Tokyo, Japan

[21] Appl. No.: 658,210

[22] Filed: Jun. 4, 1996

[30] Foreign Application Priority Data

Aug. 14, 1995 [JP] Japan .................................. 7-206926

[51] Int. Cl.$^6$ .................................................. G11C 7/00
[52] U.S. Cl. .................... 365/227; 365/230.03; 365/222; 365/203
[58] Field of Search .................... 365/230.03, 227, 365/51, 63, 203, 222

[56] References Cited

U.S. PATENT DOCUMENTS 5,463,577  10/1995  Oowaki et al. ............... 365/230.03
5,528,552  6/1996   Kamisaki ..................... 365/230.03

OTHER PUBLICATIONS

I. Naritake et al, "A Crossing Charge Recycle Refresh Scheme with a Separated Driver Sense–Amplifier for Gb DRAMs", 1995 *Symposium on VLSI Circuits, Digest of Technical Papers*, Jun. 8–10, 1995, Japan, pp., 101–102; IEEE Cat. No. 95 CH 35780.

*Primary Examiner*—David C. Nelms
*Assistant Examiner*—Huan Hoang
*Attorney, Agent, or Firm*—Sughrue, Mion, Zinn, Macpeak & Seas

[57] ABSTRACT

A data refresh is indispensable for a semiconductor dynamic random access memory device, and electric charges are recycled from bit line pairs for a row of memory cell arrays to power supply lines for bit line drivers associated with the next row of memory cell arrays and from bit line pairs for the next row of memory cell arrays to power supply lines for the row of memory cell arrays, thereby reducing power consumption in the data refresh.

4 Claims, 6 Drawing Sheets

LOW POWER CONSUMPTION SEMICONDUCTOR DYNAMIC RANDOM ACCESS MEMORY DEVICE BY REUSING RESIDUAL ELECTRIC CHARGE ON BIT LINE PAIRS

FIELD OF THE INVENTION

This invention relates to a semiconductor dynamic random access memory device and, more particularly, to a semiconductor dynamic random access memory device reduced in power consumption by reusing residual electric charge on bit line pairs.

DESCRIPTION OF THE RELATED ART

The semiconductor dynamic random access memory device requires a data refresh for data stored therein, and is designed to periodically restore the data bits in the memory cells during the standby. Manufacturer progressively increases the memory cells incorporated in the semiconductor dynamic random access memory device, and the data refresh consumes a large amount of electric current in the standby period. If the memory cells form a plurality of memory cell arrays, the data bits are sequentially refreshed from a memory cell array to another memory cell array, and the peak current in the standby period is effectively decreased. However, the data refresh still consumes a large amount of electric current, and the amount of electric current in the standby period is increased together with the memory cells.

An attractive technology has been proposed for drastically decreasing the amount of electric current in the standby period. When the data refresh is completed for data bits stored in one of the memory cell arrays, the electric charge is partially recycled in the refresh cycle for another memory cell array, and such cyclic electric charge reduces the electric current consumed in the standby period.

FIG. 1 illustrates the memory cell arrays and associated circuits for the cyclic reuse. The prior art semiconductor dynamic random access memory device comprises a plurality of memory cell arrays arranged in a matrix and a plurality of main word lines MW1 to MWm associated with the rows of memory cell arrays, respectively, and only one main word line MW1 is shown together with the associated row of main memory cell arrays M11 to M1n. Though not shown in FIG. 1, a main decoder changes one of the main word lines MW1 to MWm to an active high level, and the other main word lines remain inactive. The rows of memory cell arrays are similar to one another, and description is focused on only one row of memory cell arrays MA11 to MA1n.

The prior art semiconductor memory cell device further comprises a plurality of sub-decoder groups SD1 to SDn respectively associated with the memory cell arrays MA11 to MA1n, a plurality of sets of sub-word lines SW11-SW1x, SW21-SW2x, . . . and SWn1-SWnx associated with the memory cell arrays MA11 to MA1n, respectively, and a plurality of sets of bit line pairs BLP11-BLP1j, BLP21-BLP2j, . . . and BLPn1-BLPnj also associated with the memory cell arrays MA11 to MA1n, respectively.

Each of the memory cell arrays MA11 to MA1n includes memory cells MC11-MC1j to MCi1 to MCij arranged in rows and columns, and data bits are respectively stored in the memory cells MC11 to MCij. The rows of memory cells MC11-MC1j to MCi1-MCij are respectively coupled to the sub-word lines SW11/SW21/SWn1 to SW1x/SW2x/SWnx, and the columns of memory cells MC11-MCi1 to MC1j-MCij of each memory cell array are respectively connected to the bit line pairs BLP11-BLPij, BLP21-BLP2j, . . . or BLPn1-BLPnj. When the main word line MW1 is changed to the active high level, the sub-decoder groups SD1 to SDn concurrently become responsive to row address predecoded signals, and each of the sub-decoder groups SD1 to SDn changes one of the sub-word lines SW11-SW1x, SW21-SW2x, . . . or SWn1-SWnx to an active high level. Then, the memory cells of the selected rows coupled to the selected sub-word lines are electrically coupled to the associated bit line pairs, and data bits are transferred between the bit line pairs and the selected memory cells.

The prior art semiconductor dynamic random access memory device further comprises a plurality of sub-arrays SAR1, SAR2, . . . and SARn respectively coupled to the plurality of sets of bit line pairs BLP11-BLP1j, BLP21-BLP2j, . . . and BLPn1-BLPnj, a plurality of sense amplifier controlling circuits SEC1, SEC2, . . . and SECn respectively associated with the sub-arrays SAR1 to SARn and a plurality of bit line driver controlling circuits BDC1, BDC2, . . . and BDCn also associated with the sub-arrays SAR1 to SARn, respectively.

The sub-arrays SAR1 to SARn are similar in circuit configuration to one another, and one of the sub-arrays SAR1, the associated sense amplifier controlling circuit SEC1 and the associated bit line driver controlling circuit BDC1 are illustrated in detail in FIG. 2.

Turning to FIG. 2, the sub-array SAR2 includes a plurality of bit line precharge circuits BP21 to BP2j respectively connected to the bit line pairs BLP21 to BLP2j, a plurality of sense amplifiers SA21 to SA2j respectively connected to the bit line pairs BLP21 to BLP2j, a plurality of bit line drivers BD21 to BD2j also coupled to the bit line pairs BLP21 to BLP2j, respectively, and an equalizer EQ2 for power supply lines SAP and SAN. Bit lines BLa and BLb form each of the bit line pair BLP21 to BLP2j, and the sense amplifiers SA21 to SA2j are respectively connected through pairs of data transfer lines SR21/CSR21 to SR2j/CSR2j to the bit line drivers BD21 to BD2j, respectively.

The bit line precharge circuits BP21 to BP2j are similar in circuit configuration to One another, and three n-channel enhancement type switching transistors Qn1, Qn2 and Qn3 form each of the bit line precharge circuits BP21 to BP2j. The n-channel enhancement type switching transistor Qn1 is connected between the bit lines BLa and BLb, and the n-channel enhancement type switching transistors Qn2 and Qn3 are connected between an intermediate voltage line HV and the bit lines BLa and BLb. A precharge control signal line is connected to the gate electrodes of the n-channel enhancement type switching transistors Qn1 to Qn3, and a precharge control signal PC2 of an active high level causes the n-channel enhancement type switching transistors Qn1 to Qn3 to concurrently turn on so as to equalize the associated bit lines BLa and BLb at an intermediate potential level HV between a positive power voltage level Vcc and the ground level.

The equalizer EQ2 is similar in circuit arrangement to the bit line precharge circuits BP21 to BP2j, and three n-channel enhancement type switching transistors Qn4, Qn5 and Qn6 form the equalizer EQ1. The n-channel enhancement type switching transistor Qn4 is connected between the power supply lines SAP and SAN, and the other n-channel enhancement type switching transistors Qn5 and Qn6 are connected between the intermediate voltage line HV and the power supply lines SAP/SAN, respectively. The precharge control signal PC2 is also supplied to the gate electrodes of the n-channel enhancement type switching transistors Qn4 to Qn6, and the power supply lines SAP and SAN are equalized at the intermediate potential level HV.

The sense amplifiers SA21 to SA2j are similar in circuit configuration to one another, and the sense amplifier SA21 has two series combinations of p-channel enhancement type switching transistors Qp1/Qp2, common drain nodes DN1/DN2 and n-channel enhancement type switching transistors Qn7/Qn8 coupled between the power supply lines SAP and SAN and two n-channel enhancement type switching transistors Qn9/Qn10 coupled between the common drain nodes DN1/DN2 and the bit lines BLa/BLb. A sense control signal BSC of the active high level is supplied to the gate electrodes of the n-channel enhancement type switching transistors Qn9 and Qn10, and causes the n-channel enhancement type switching transistors Qn9 and Qn10 to electrically connect the bit lines BLa and BLb to the common drain nodes DN1 and DN2.

The common drain node DN1 is connected to the gate electrode of the p-channel enhancement type switching transistor Qp2 and the gate electrode of the n-channel enhancement type switching transistor Qn8, and the other common drain node DN2 is connected to the gate electrode of the p-channel enhancement type switching transistor Qp1 and the gate electrode of the n-channel enhancement type switching transistor Qn7.

While the equalizer EQ2 maintains the power supply lines SAP and SAN at the intermediate voltage level HV, the sense amplifiers SA21 to SA2j are disabled. However, after the equalizer EQ2 electrically isolates the power supply lines SAP and SAN from each other, a p-channel enhancement type switching transistor Qp3 and an n-channel enhancement type switching transistor Qn11 of the associated sense amplifier controlling circuit SEC2 supply the ground level and the positive power voltage Vcc through the power supply lines SAN and SAP to the sense amplifier SA11 in response to an enable signal SE2 and the complementary signal CSE2, and the two series combinations Qp1/Qp2 and Qn7/Qn8 rapidly increase the small potential difference to a large potential difference.

The bit line drivers BD21 to BD2j are similar in circuit configuration to one another. The bit line driver BD21 is implemented by two series combination of p-channel enhancement type switching transistors Qp4/Qp5, common drain nodes DN3/DN4 and n-channel enhancement type switching transistors Qn12/Qn13 coupled between power supply lines LH2 and LG2. The common drain nodes DN3 and DN4 are respectively connected to the bit lines BLa/BLb, and the common drain nodes DN1 and DN2 are connected through the data transfer lines SR11/CSR11 to the gate electrodes of the p-channel/n-channel enhancement type switching transistors Qp5/Qn13 and the gate electrodes of the p-channel/n-channel enhancement type switching transistors Qp4/Qn12, respectively.

The power supply lines LH2 and LG2 are connected to the bit line driver controlling circuit BDC2, and the bit line driver controlling circuit BDC2 has a p-channel enhancement type switching transistor Qp6 coupled between the positive power supply line Vcc and the power supply line LH2, an n-channel enhancement type switching transistor Qn14 coupled between the ground line and the other power supply line LG2, a p-channel enhancement type transfer transistor Qp7 coupled between the power supply line LH2 and a power supply line LH1 of the adjacent sub-array SAR1 and an n-channel enhancement type transfer transistor Qn15 coupled between the power supply line LG2 and a power supply line LG1 of the adjacent sub-array SAR1.

The n-channel enhancement type transfer transistor Qn15 and the p-channel enhancement type transfer transistor Qp7 are responsive to a transfer signal TC2 and the complementary signal CTC2 for coupling the power supply lines LG1/LH1 to the power supply lines LG2/LH2. On the other hand, the n-channel enhancement type switching transistor Qn14 and the p-channel enhancement type switching transistor Qp6 are responsive to an enable signal BE2 and the complementary signal CBE2 for coupling the ground line and the positive power voltage line Vcc to the power supply lines LG2/LH2, respectively.

Thus, the bit line driver controlling circuits BDC2 to BDCn electrically connect the power supply lines LH2/LG2 to LHn/LGn to the adjacent power supply lines LH1/LG1 to LH(n−1)/LG(n−1) and electrically isolate these power supply lines LH2/LG2 to LHn/LGn from the adjacent power supply lines LH1/LG1 to LH(n−1)/LG(n−1) in response to the transfer signals TC2/CTC2 to TCn/CTCn (see FIG. 1). However, no transfer signal is supplied to the bit line driver controlling circuit BDC1, because no sub-array is provided on the left side thereof.

The prior art semiconductor dynamic random access memory device behaves as follows. FIG. 3 illustrates a sequential refresh, and description is made on the assumption that the rows of memory cells MC11 to MCij are selected from the memory cell arrays MA11 to MA1n.

The precharge control signals PC1 to Pan are in the active high level before the entry into the data refresh, and all of the bit line precharge circuits of the sub-arrays SAR1 to SARn charge the bit line pairs BP11-BP1j, BP21-BP2j, ... and BPn1-BPnj to the intermediate voltage level HV. The precharge control signals PC1 to PCn further cause the equalizers to keep the power supply lines SAP and SAN at the intermediate voltage level HV.

The sense control signals BSC1 to BSCn are in the active high level before the entry into the data refresh, and cause the n-channel enhancement type switching transistors Qn9 and Qn10 to turn on. The intermediate voltage level HV is propagated through the n-channel enhancement type switching transistors Qn9 and Qn10 to the pairs of data transfer lines SR11/SRn1 to SR1j/SRnj and CSR11/CSRn1 to CSR1j/CSRnj of the sub-arrays SAR1 to SARn, and the pairs of data transfer lines SR11/SRn1 to SR1j/SRnj and CSR11/CSRn1 to CSR1j/CSRnj are also maintained at the intermediate voltage level HV.

The precharge control signals PC1 to PCn start to decay from the active high level to the inactive low level at time t1, and the n-channel enhancement type switching transistors Qn1 to Qn3 and Qn4 to Qn6 turn off. The bit lines BLa are electrically isolated from the bit lines BLb, respectively; however, the bit lines BLa and BLb are maintained at the intermediate voltage level HV. The equalizers isolate the power supply lines SAP from the power supply lines SAN, respectively, and keeps the power supply lines SAP and SAN at the intermediate voltage level HV.

The sub-word lines SW11 to SWn1 start to rise from the inactive low level to the active high level at time t2, and the storage capacitors CP of the memory cells MC11 to MC1j incorporated in all the memory cell arrays MA11 to MA1n are electrically connected to the bit lines BLa. Electric charge flows from the bit lines BLa to the storage capacitors CP or from the storage capacitors CP to the bit lines BLa. In this instance, all the storage capacitors CP are assumed to store data bits of logic "0" corresponding to the ground level, and the bit lines BLa are slightly decayed. As a result, small potential differences take place on the bit line pairs BLP11-BLP1j to BLPn1-BLPnj. The small potential differences are propagated through the n-channel enhancement type switching transistors QN9 and Qn10 to the pairs of data transfer lines SR11/SRn1 to SR1j/SRnj and CSR11/CSRn1 to CSR1j/CSRnj.

The sense control signals BSC1 to BSCn start to decay from the active high level to the inactive low level at time t3, and cause the n-channel enhancement type switching transistors Qn9/Qn10 to turn off. As a result, the common drain nodes DN1/DN2 of all the sense amplifiers are electrically isolated from the associated bit line pairs BLP11-BLP1j to BLPn1-BLPnj.

The enable signals SE1 to SEn start to rise from the inactive low level to the active high level at time t4, and, accordingly, the complementary signals CSE1 to CSEn are decayed to the low level. The enable signals SE1 to SEn cause the n-channel enhancement type switching transistors Qn11 to turn on, and the complementary signals CSE1 to CSEn also cause the p-channel enhancement type switching transistors Qp3 to turn on. The positive power voltage Vcc and the ground level are supplied to the power supply lines SAP and the power supply lines SAN, and all of the sense amplifier circuits of the sub-arrays SAR1 to SARn are concurrently activated. The sense amplifiers increase the small potential differences between the common drain nodes DN1 and DN2, and large potential differences are propagated through the pairs of data transfer lines SR11/San1 to SR1j/SRnj and CSR11/CSRn1 to CSR1j/CSRnj to the bit line drivers of all the sub-arrays SAR1 to SARn.

The enable signal BE1 starts to rise from the inactive low level to the active high level at time t5, and the complementary signal CBE1 is concurrently decayed to the low level. The bit line driver controlling circuit BDC1 is activated, and supplies the positive power voltage Vcc and the ground level to the power supply lines LH1 and LG1. Then, the bit line drivers BD11 to BD1j of the sub-array SAR1 are activated, and increase the small potential differences on the bit line pairs BLP11 to BLP1j. Thus, the data bits stored in the memory cells MC11 to MC1j of the memory cell array MA11 are increased to the restore level, and, accordingly, are refreshed.

The sub-word line SW1 starts to decay from the active high level to the inactive low level at time t6, and the data bits are restored in the memory cells MC11 to MC1j of the memory cell array MA11.

After the restore of the read-out data bits to the memory cells MC11 to MC1j of the memory cell array MA11, the enable signal BE1 is decayed at time t7, and the complementary signal CBE1 concurrently rises to the high level. As a result, the power supply lines LH1/LG1 are electrically isolated from the positive power voltage line Vcc and the ground voltage source.

The transfer signal TC2 starts to rise from the inactive low level to the active high level at time t7, and the complementary signal CTC2 is concurrently decayed to the low level. The n-channel enhancement type transfer transistor Qn15 and the p-channel enhancement type transfer transistor Qp7 concurrently turn on, and the power supply line LH2 and the power supply line LG2 are equalized to the power supply line LH1 and the power supply line LG1, respectively.

The bit line drivers BD21 to BD2j are powered through the power supply lines LH2/LG2, and are responsive to the large potential differences between the common drain nodes DN1 and DN2 so as to increase the small potential differences on the bit line pairs BLP21 to BLP2j to middle potential differences. Thus, the bit line drivers BD21 to BD2j increase the small potential differences to the middle potential differences without power supply from the positive power voltage line Vcc and the ground voltage line. The bit line pairs BLP11 to BLP1j and the associated circuits are assumed to be equal in parasitic capacitance to the bit line pairs BLP21 to BLP2j and the associated circuits, and a high potential level at 3 Vcc/4 and a low potential level at Vcc/4 define the middle potential differences on the bit line pairs BLP21 to BLP2j.

The transfer signal TC2 starts to decay from the active high level to the inactive low level at time t8, and the complementary signal CTC2 is concurrently rises to the high level. The n-channel enhancement type transfer transistor Qn15 and the p-channel enhancement type transfer transistor Qp7 turn off, and the power supply lines LH2/LG2 are electrically isolated from the power supply lines LH1/LG1, respectively.

The enable signal BE2 starts to rise from the inactive low level to the active high level at time t8, and the complementary signal CBE2 is concurrently decayed to the low level. The n-channel enhancement type switching transistor Qn14 and the p-channel enhancement type switching transistor Qp6 turn on, and the power supply lines LH2/LG2 are connected to the positive power voltage line Vcc and the ground voltage line, respectively. The bit line drivers BD21 to BD2j are fully activated, and the middle potential differences on the bit line pairs BLP21 to BLP2j are increased to large potential differences. Thus, the data bits on the bit line pairs BLP21 to BLP2j are refreshed by the bit line drivers BD21 to BD2j, respectively.

The sub-word line SW2 is decayed at time t9, and the refreshed data bits are stored in the memory cells MC11 to MC1j of the memory cell array MA12.

The prior art semiconductor dynamic random access memory device sequentially refreshes the data bits read out from the next memory cell array to the data bits read out from the memory cell array MAln between time t10 and time t11, and changes the precharge control signals PC1 to PCn to the high level at time t12 so as to charge the bit lines BLa and BLb at the intermediate voltage level HV.

Thus, the prior art semiconductor dynamic random access memory device recycles the electric charges left on the power supply lines for increasing the small potential differences to the middle potential differences, and effectively reduces the power consumption in the data refresh. Although the leftmost sub-array SAR1 is fully powered by the positive power voltage line Vcc and the ground voltage line, the other sub-array SAR2 to SARn recycle the electric charge on the power supply lines for the sub-arrays SAR1 to SAR(n−1) on the left side thereof, and the power consumption is reduced to a half of the electric power consumed by the sub-array SAR1. If the prior art semiconductor dynamic random access memory device includes four memory cell arrays, the power consumption in the data refresh is reduced to 5/8 of the electric power consumed by a semiconductor dynamic random access memory device without the recycle. When the number of the memory cell arrays is further increased, the power reduction ratio is getting closer to ½.

However, the reduction of power consumption is insufficient for a semiconductor dynamic random access memory device of the next generation.

SUMMARY OF THE INVENTION

It is therefore an important object of the present invention to provide a semiconductor dynamic random access memory device which is further reduced in power consumption.

The present inventors contemplated the problem, and noticed that power supply lines and bit line pairs still accumulated electric charge upon completion of the data refresh on a row of memory cell arrays. The present inventors concluded that if the electric charge was recycled between different memory cell arrays, the power consumption would be further reduced.

To accomplish the object, the present invention proposes to transfer residual electric charge from bit line pairs through associated power supply lines to power supply lines associated with another row of sub-arrays.

In accordance with the present invention, there is provided a semiconductor dynamic random access memory device comprising: a plurality of memory cell arrays divided into a plurality of memory cell array groups, each of the plurality of memory cell array including a plurality of dynamic random access memory cells arranged in rows and columns and respectively storing data bits in the form of electric charge; a plurality of bit line pair groups respectively associated with the plurality of memory cell arrays, each of the plurality of bit line pair groups including a plurality of bit line pairs respectively coupled to the columns of dynamic random access memory cells of associated one of the plurality of memory cell arrays for propagating the data bits thereto and therefrom; a plurality of main word lines respectively associated with the plurality of memory cell array groups, and selectively changed to an active level; a plurality of sub-word line groups respectively associated with the plurality of memory cell array groups, each of the plurality of sub-word line groups including a plurality of sub-word lines respectively coupled to the rows of dynamic random access memory cells and selectively changed to an active level so as to transfer the data bits between a selected row of dynamic random access memory cells and the associated one of the plurality of bit line pair groups; a plurality of sub-arrays respectively coupled through the plurality of bit line pair groups to the plurality of memory cell arrays, and divided into a plurality of sub-array groups respectively associated with the plurality of memory cell array groups, each of the plurality of sub-arrays including a plurality of precharge circuits respectively coupled to the plurality of bit line pairs of associated one of the plurality of bit line groups for charging the plurality of bit line pairs to an intermediate potential level in a first phase, a plurality of sense amplifiers respectively having pairs of sense nodes connectable to the plurality of bit line pairs in a second phase after the first phase when the data bits are read out from a selected one of the rows of dynamic random access memory cells for generating small potential differences on the plurality of bit line pairs, a first controlling means for causing the plurality of sense amplifiers to increase the small potential differences at the pairs of sense nodes to large potential differences in a third phase after the second phase, a plurality of bit line drivers respectively coupled to the plurality of bit line pairs and powered through a power supply means for stepwise increasing the small potential differences on the plurality of bit line pairs to large potential differences in response to the large potential differences at the pairs of sense nodes, and a second controlling means having a transfer sub-means for coupling the power supply means to another power supply means of another of the plurality of sub-arrays already increased small potential differences on associated bit line pairs to large potential differences and incorporated in the same sub-array group, thereby causing the plurality of bit line drivers to increase the small potential differences to middle potential differences in a fourth phase after the third phase, the second controlling means further having a power supply sub-means for coupling the power supply means to a source of power voltage, thereby increasing the middle potential differences to the large potential differences in a fifth phase after the fourth phase; and a charge transfer means coupled between the associated one of the plurality of bit line groups and another of the plurality of bit line groups associated with another of the plurality of memory cell groups for equalizing the aforesaid another of the plurality of bit line groups with the associated one of the plurality of bit line groups in a sixth phase after the fifth phase when other small potential differences has already taken place on the aforesaid another of the plurality of bit line groups.

BRIEF DESCRIPTION OF THE DRAWINGS

The features and advantages of the semiconductor dynamic random access memory device according to the present invention will be more clearly understood from the following description taken in conjunction with the accompanying drawings in which.

DESCRIPTION OF THE PREFERRED EMBODIMENT

Figure 4:
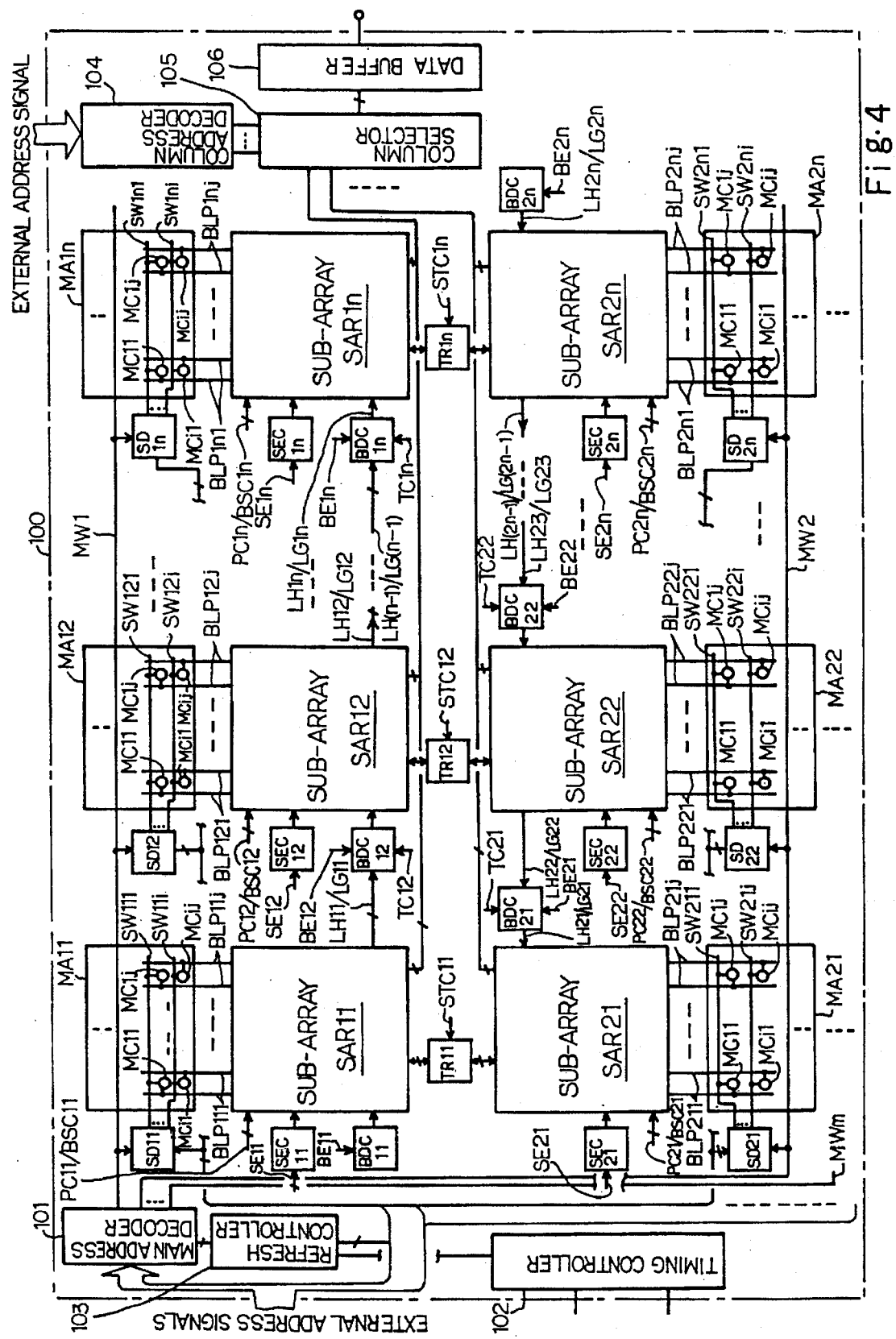
FIG. 4 is a block diagram showing the arrangement of a semiconductor dynamic random access memory device according to the present invention.

Referring to FIG. 4 of the drawings, a semiconductor dynamic random access memory device embodying the present invention is fabricated on a semiconductor chip 100. The semiconductor dynamic random access memory device stores data bits through a write-in sequence, reads out the data bits through a read-out sequence, and periodically refreshes the data bits through a refresh sequence.

Description is firstly made on circuits incorporated in the semiconductor dynamic random access memory device. The semiconductor dynamic random access memory device comprises a plurality of memory cell arrays arranged in rows and columns and a plurality of main word lines MW1, MW2, ... and MWm respectively associated with the rows of memory cell arrays, and only two rows of memory cell arrays MA11-MA1n and MA21-MA2n are illustrated in FIG. 4. These rows of memory cell arrays MA11-MA1n and MA21-MA2n are associated with the main word lines MW1 and MW2.

The semiconductor memory cell device further comprises a main decoder 101 and a plurality of sub-decoder groups respectively coupled to the main word lines MW1 to MWm. The main decoder 101 is responsive to an external address signal in the write-in/read-out sequences and an internal address signal in the refreshing sequence for selecting one of the main word lines MW1 to MWm. The main decoder 101 changes the selected main word line to an active level, and the selected main word line enables the associated one of the sub-decoder groups. Only two sub-decoder groups SD11-SD1n and SD21-SD2n are shown in FIG. 4, and the sub-decoders SD11-SD1n and SD21-SD2n are respectively associated with the memory cell arrays MA11-MA1n and MA21-MA2n, respectively.

Each of the memory cell arrays includes memory cells MC11-MC1j to MCi1 to MCij arranged in rows and columns, and each of the memory cells MC11 to MCij is implemented by a series of an n-channel enhancement type switching transistor and a storage capacitor. Data bits are respectively stored in the memory cells MC11 to MCij in the form of electric charge, and the data bit has either logic "1" or logic "0" depending upon the potential level at the storage capacitor.

The semiconductor dynamic random access memory device further comprises a plurality of sets of sub-word lines and a plurality of sets of bit line pairs both provided for the plurality of memory cell arrays, respectively. For example, the sets of sub-word lines SW111-SW11i, SW121-SW12i, SW1n1-SW1ni, SW211-SW21i, SW22i-SW22i and SW2n1-SW2ni are provided for the memory cell arrays MA11, MA12, MA1n, MA21, MA22 and MA2n, respectively. The sets of sub-word lines are respectively connected to the sub-decoders, and the rows of memory cells MC11-MC1j to MCi1-MCij of each memory cell array are respectively coupled to the sub-word lines of the associated set.

The plurality of sets of bit line pairs are provided for the memory cell arrays, respectively. For example, the sets of bit line pairs BLP111-BLP11j, BLP121-BLP12j, BLP1n1-BLP1nj, BLP211-BLP21j, BLP221-BLP22j and BLP2n1-BLP2nj are provided for the memory cell arrays MA11-MA1n and MA21-MA2n, respectively. The bit line pairs of each set are connected to the columns of memory cells MC11-MCi1 to MC1j-MCij of the associated memory cell array, and propagates data bits in the form of potential difference from and to a row of memory cells connected to a selected one of the sub-word lines. Bit lines BLa and BLb form each of the bit line pair BLP111 to BLP2nj.

When the main decoder 101 energizes one of the main word line such as the main word line MW1, the set of sub-decoders SD11 to SD1n are enabled, and are responsive to an external address signal or an internal address signal so as to select one sub-word line from each set. The sub-decoders SD11 to SD1n change the selected sub-word lines such as the sub-word lines SW111, SW121, ... and SW1n1 to an active high level, and the data bits are transferred between the sets of bit line pairs BLP111-BLP11j, BLP121-BLP12j, ... and BLP1n1-BLP1nj and the rows of memory cells MC11 to MC1j of the memory cell arrays MA11 to MA1n.

The prior art semiconductor dynamic random access memory device further comprises a plurality of sub-arrays respectively associated with the memory cell arrays, a plurality of first controllers respectively connected to the sub-arrays and a plurality of second controllers connected to the sub-arrays, respectively. For example, the memory cell arrays MA11-MA1n and MA21-MA2n are respectively associated with the sub-arrays SAR11-SAR1n and SAR21-SAR2n, and the first controllers SEC11-SEC1n and SEC21-SEC2n and the second controllers BDC11-BDC1n and BDC21-BDC2n are connected to the sub-arrays SAR11-SAR1n and SAR21-SAR2n. The sub-arrays are connected to the sets of bit line pairs, and carry out a precharge/equalization and a development of small potential differences. The first controllers and the second controllers are hereinlater described in detail with reference to FIG. 5.

The semiconductor dynamic random access memory device further comprises a plurality of rows of transfer circuits each shared between the adjacent two rows of sub-arrays. The row of transfer circuits TR11-TR1n is, by way of example, shared between the adjacent two row of sub-arrays SAR11-SAR1n and SAR21-SAR2n. Each of the transfer circuits is connected between the associated sub-arrays, and transfers residual electric charge therebetween. The transfer circuit is also described in detail with reference to FIG. 5.

The semiconductor dynamic random access memory device further comprises a timing controller 102, a refresh controller 103, a column address decoder 104, a column selector 105 and a data buffer 106. The timing controller 102 generates internal control signals, and the internal control signals controls the write-in sequence, the read-out sequence and the data refresh. The refresh controller 103 is enabled in the data refresh, and generates the internal address signals for the main decoder 101 and the sub-decoders.

An external address signal is supplied to the column address decoder 104, and the column address decoder 104 decodes the external address signal for generating column address decoded signals. The column selector 105 is connected to the sub-arrays, and is responsive to the column address decoded signals so as to selectively connect the sub-arrays to the data buffer 106. An input data signal is supplied to the data buffer 106, and write-in data bit or bits are transferred from the data buffer 106 to selected sub-array or sub-arrays in the write-in sequence. On the other hand, the sub-arrays are selectively connected through the column selector 105 to the data buffer 106, and the data buffer 106 generates an output data signal representative of the read-out data bit or bits.

Figure 5:
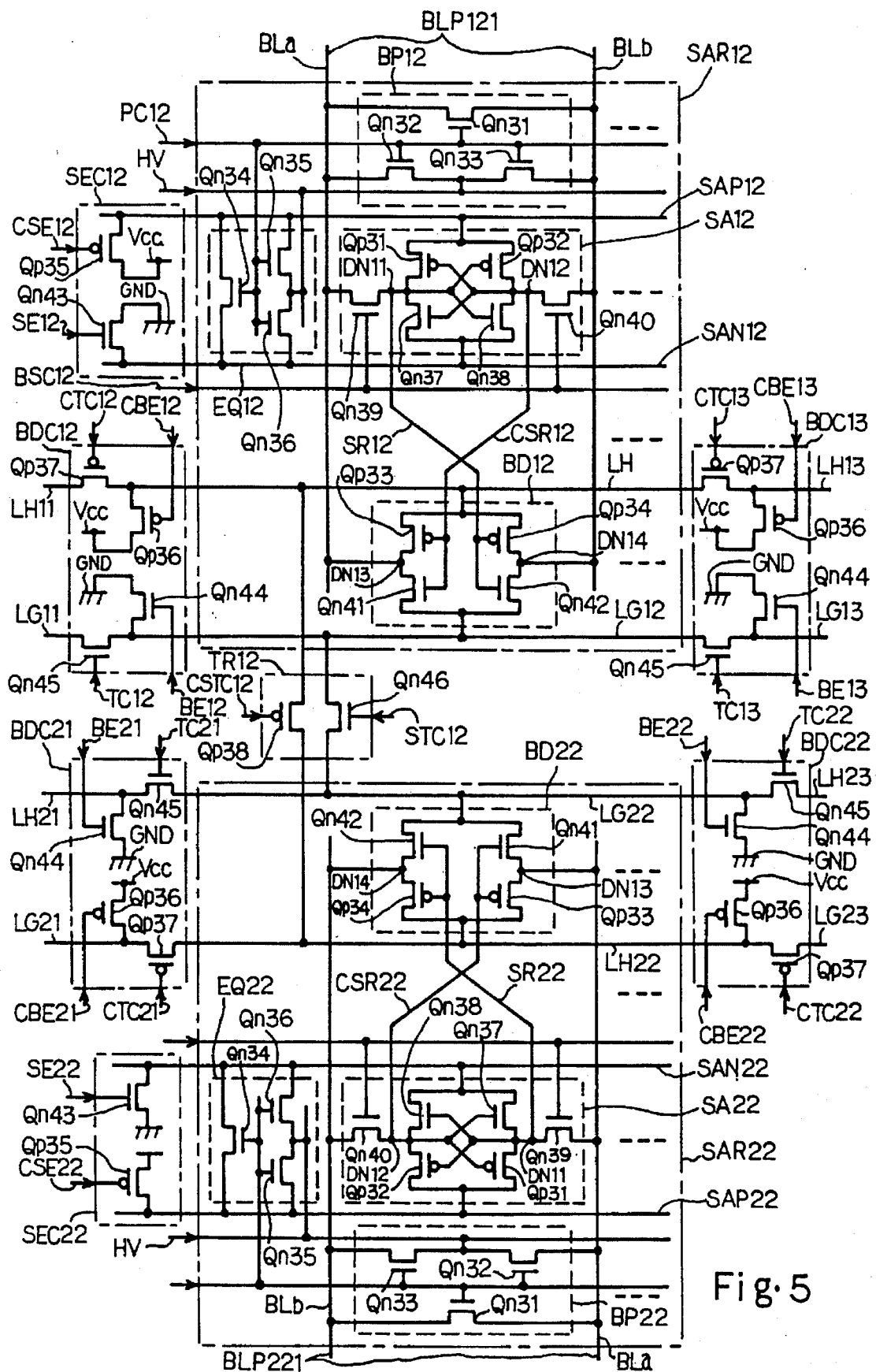
FIG. 5 is a circuit diagram showing the circuit configuration of adjacent two sub-arrays incorporated in the semiconductor dynamic random access memory device.

The sub-arrays are similar in circuit configuration to one another, and FIG. 5 illustrates two sub-arrays SAR12 and SAR22, the associated first controllers SEC12 and SEC22, the associated second controllers BDC12/BDC13 and BDC21/BDC22 and the transfer circuit TR12 shared between the sub-arrays SAR12 and SAR22.

In detail, the sub-array SAR12 includes a plurality of bit line precharge circuits BP12 respectively connected to the bit line pairs BLP121 to BLP12j, a plurality of sense amplifiers SA12 respectively connected to the bit line pairs BLP121 to BLP12j, a plurality of bit line drivers BD12 also coupled to the bit line pairs BLP121 to BLP12j, respectively, and an equalizer EQ12 connected to power supply lines SAP12 and SAN12. The sense amplifiers SA12 are respectively connected through pairs of data transfer lines SR12/CSR12 to the bit line drivers BD12, respectively, and the bit line drivers BD12 are powered through power supply lines LH12 and LG12.

The first controller SEC12 is connected to the power supply lines SAP12 and SAN12, and supplies a positive power voltage Vcc and the ground level thereto in response to a first enable signal SE12 and the complementary signal CSE12. The first enable signal SE12 and the complementary signal CSE12 are two of the internal control signals.

The second controllers BDC12 and BDC13 are connected to both ends of the power supply lines LH12 and LG12. The second controllers BDC12 and BDC13 are responsive to first transfer control signals TC12 and TC13 and the complementary signals CTC12 and CTC13 so as to couple the power supply lines LH12 and LG12 to adjacent power supply lines LH11 and LG11 associated with the sub-array SAR11 and to adjacent power supply lines LH13 and LG13 associated with the sub-array SAR13 (not shown) on the right side of the sub-array SAR12.

The second controllers BDC12 and BDC13 are further responsive to second enable signals BE12/BE13 and the complementary signals CBE12/CBE13 so as to supply the positive power voltage Vcc and the ground level to the power supply lines LH12/LG12 and LH13/LG13. The first transfer control signals TC12/TC13, the complementary signals CTC12/CTC13, the second enable signals BE12/BE13 and the complementary signals CBE12/CBE13 are other internal control signals.

The sub-array SAR22 includes a plurality of bit line precharge circuits BP22 respectively connected to the bit line pairs BLP221 to BLP22j, a plurality of sense amplifiers SA22 respectively connected to the bit line pairs BLP221 to BLP22j, a plurality of bit line drivers BD22 also coupled to the bit line pairs BLP221 to BLP22j, respectively, and an equalizer EQ22 connected to power supply lines SAP22 and SAN22. The sense amplifiers SA22 are respectively connected through pairs of data transfer lines SR22/CSR22 to the bit line drivers BD22, respectively, and the bit line drivers BD22 are powered through power supply lines LH22 and LG22.

The first controller SEC22 is connected to the power supply lines SAP22 and SAN22, and supplies a positive power voltage Vcc and the ground level thereto in response to a first enable signal SE22 and the complementary signal CSE22. The first enable signal SE22 and the complementary signal CSE22 are other two of the internal control signals.

The second controllers BDC21 and BDC22 are connected to both ends of the power supply lines LH22 and LG22. The second controllers BDC21 and BDC22 are responsive to first transfer control signals TC21 and TC22 and the complementary signals CTC21 and CTC22 so as to couple the power supply lines LH22 and LG22 to adjacent power supply lines LH21 and LG21 associated with the sub-array SAR21 and to adjacent power supply lines LH23 and LG23 associated with the sub-array SAR23 (not shown) on the right side of the sub-array SAR22.

The second controllers BDC21 and BDC22 are further responsive to second enable signals BE21/BE22 and the complementary signals CBE21/CBE22 so as to supply the positive power voltage Vcc and the ground level to the power supply lines LH21/LG21 and LH22/LG22. The first transfer control signals TC21/TC22, the complementary signals CTC21/CTC22, the second enable signals BE21/BE22 and the complementary signals CBE21/CBE22 are other internal control signals.

The bit line precharge circuits, the equalizers, the sense amplifiers, the bit line drivers, the first controllers, the second controllers and the transfer circuits are hereinbelow described in detail. These circuits have respective similar circuit configurations, and description is made on the circuits incorporated in and associated with the sub-array SAR12. The circuits components of the other circuits are labeled with the same references without description, and internal control signals supplied thereto are designated by like references, i.e., the same alphabetic letters with different numerals.

The bit line precharge circuit BP12 is implemented by three n-channel enhancement type switching transistors Qn31, Qn32 and Qn33. The n-channel enhancement type switching transistor Qn31 is connected between the bit lines BLa and BLb of the associated bit line pair, and the n-channel enhancement type switching transistors Qn32 and Qn33 are connected between an intermediate voltage line HV and the bit lines BLa and BLb. A precharge control signal PC12 of an active high level is supplied to the gate electrodes of the n-channel enhancement type switching transistors Qn31 to Qn33 so that the n-channel enhancement type switching transistors Qn31 to Qn33 concurrently turn on. The bit lines BLa and BLb are charged and equalized at an intermediate potential level HV between a positive power voltage level Vcc and the ground level.

Three n-channel enhancement type switching transistors Qn34, Qn35 and Qn36 form the equalizer EQ12. The n-channel enhancement type switching transistor Qn34 is connected between the power supply lines SAP and SAN, and the other n-channel enhancement type switching transistors Qn35 and Qn36 are connected between the intermediate voltage line HV and the power supply lines SAP/SAN, respectively. The precharge control signal PC12 is also supplied to the gate electrodes of the n-channel enhancement type switching transistors Qn34 to Qn36, and the power supply lines SAP and SAN are equalized at the intermediate potential level HV.

The sense amplifier SA12 has two series combinations of p-channel enhancement type switching transistors Qp31/Qp32, common drain nodes DN11/DN12 and n-channel enhancement type switching transistors Qn37/Qn38 coupled between the power supply lines SAP and SAN and two n-channel enhancement type switching transistors Qn39/Qn40 coupled between the common drain nodes DN11/DN12 and the bit lines BLa/BLb. A sense control signal BSC12 of the active high level is supplied to the gate electrodes of the n-channel enhancement type switching transistors Qn39 and Qn40, and causes the n-channel enhancement type switching transistors Qn39 and Qn40 to electrically connect the bit lines BLa and BLb to the common drain nodes DN11 and DN12.

The common drain node DN11 is connected to the gate electrode of the p-channel enhancement type switching transistor Qp32 and the gate electrode of the n-channel enhancement type switching transistor Qn38, and the other common drain node DN12 is connected to the gate electrode of the p-channel enhancement type switching transistor Qp31 and the gate electrode of the n-channel enhancement type switching transistor Qn37.

While the equalizer EQ12 maintains the power supply lines SAP and SAN at the intermediate voltage level HV, the sense amplifiers SA12 are disabled. However, the equalizer EQ12 electrically isolates the power supply lines SAP and SAN from each other in response to the precharge control signal PC12 of the inactive low level, and the first controller SEC12 supplies the positive power voltage Vcc and the ground level to the power supply lines SAP and SAN in response to the first enable signal. When the sense amplifiers SA12 are powered through the power supply lines SAP and SAN, the p-channel enhancement type switching transistors Qp31 and Qp32 and the n-channel enhancement type switching transistors Qn37 and Qn38 complementarily turn on and off so as to develop small potential differences between the common drain nodes DN11 and DN12.

The bit line driver BD12 is implemented by two series combination of p-channel enhancement type switching transistors Qp33/Qp34, common drain nodes DN13/DN14 and n-channel enhancement type switching transistors Qn41/Qn42 coupled between power supply lines LH12 and LG12. The common drain nodes DN13 and DN14 are respectively connected to the bit lines BLa/BLb, and the common drain nodes DN11 and DN12 of the associated sense amplifier SA12 are connected through the data transfer lines SR12/CSR12 to the gate electrodes of the p-channel/n-channel enhancement type switching transistors Qp34/Qn42 and the gate electrodes of the p-channel/n-channel enhancement type switching transistors Qp33/Qn41, respectively.

The two series combinations Qp33/Qn41 and Qp34/Qn42 are responsive to the potential difference between the common drain nodes DN11 and DN12, and the p-channel enhancement type switching transistors Qp33/Qp34 and the n-channel enhancement type switching transistors Qn41/Qn42 complementarily turn on and off so as to develop the potential difference between the common drain nodes DN13 and DN14.

The power supply lines LH12 and LG12 are connected to the second controller BDC12, and the power supply lines LH12 and LG12 are stepwise powered by the second controller BDC12.

The first controller SEC12 has a p-channel enhancement type switching transistor Qp35 coupled between the positive power supply line Vcc and the power supply line SAP and an n-channel enhancement type switching transistor Qn43 coupled between the ground voltage line GND and the power supply line SAN. The n-channel enhancement type switching transistor Qn43 and the p-channel enhancement type switching transistor Qp35 are gated by the first enable signal SE12 of the active high level and the complementary signal CSE12, and concurrently turn on for supplying the positive power voltage level Vcc and the ground level to the power supply lines SAP and SAN.

The second controller BDC12 has a p-channel enhancement type switching transistor Qp36 coupled between the power supply line LH12 and the positive power voltage line Vcc, a p-channel enhancement type transfer transistor Qp37 coupled between the power supply line LH12 and the adjacent power supply line LH11, an n-channel enhancement type switching transistor Qn44 coupled between the power supply line LG12 and the ground line GND and an n-channel enhancement type transfer transistor Qn45 coupled between the power supply line LG12 and the adjacent power supply line LG11.

The n-channel enhancement type switching transistor Qn44 and the p-channel enhancement type switching transistor Qp36 are responsive to the second enable signal BE12 of the active high level and the complementary signal CBE12 so as to supply the ground level and the positive power voltage Vcc to the power supply lines LG12 and LH12.

The n-channel enhancement type transfer transistor Qn45 and the p-channel enhancement type transfer transistor Qp37 are responsive to the first transfer control signal TC12 of the active high level and the complementary signal CTC12 for coupling the power supply lines LG12/LH12 to the power supply lines LG11/LH11.

Thus, the second controller BDC12 firstly equalizes the power supply lines LH12/LG12 with the power supply lines LH11/LG11, and, thereafter, boosts the power supply lines LH12/LG12 to the positive power voltage level Vcc and the ground level. However, the second controllers BDC11 and BDC2n do not have a transfer transistors, because no sub-array is provided on the left side thereof and the right side thereof.

The transfer circuit TR12 is implemented by a parallel combination of a p-channel enhancement type switching transistor Qp38 and an n-channel enhancement type switching transistor Qn46. The p-channel enhancement type switching transistor Qp38 is coupled between the power supply lines LH12 and LH22, and the n-channel enhancement type switching transistor Qn46 is coupled between the power supply lines LG12 and LG22. The n-channel enhancement type switching transistor Qn46 and the p-channel enhancement type switching transistor Qp38 are responsive to a second transfer control signal STC12 of the active high level and the complementary signal CSTC12, and concurrently connect the power supply lines LH12/LG12 to the power supply lines LH22/LG22.

The semiconductor dynamic random access memory device behaves as follows.

When an input data signal is supplied to the data buffer 106, the semiconductor dynamic random access memory device starts the write-in sequence. The sub-arrays have precharged and equalized the sets of bit line pairs. The main address decoder 101 changes one of the main word lines MW1 to MWm represented by the external address signal to the active level, and the selected main word line enables the associated row of sub-decoders. The row of sub-decoders are responsive to the external address signal, and change selected sub-word lines to the active high level. The memory cells coupled to the selected sub-word lines produce potential differences on the associated bit line pairs, and sub-arrays increase the potential differences on the bit line pairs. The column address decoder 104 decodes an external address signal, and causes the column selector 105 to connect the data buffer 106 to the bit line pairs associated with selected memory cells. The data buffer 106 produces potential differences representative of the input data signal, and the potential differences are transferred to the selected bit line pairs. Thus, the potential differences representative of the input data signal are stored in the memory cells selected by the external address signals.

When data bits stored in the memory cells are accessed, the main address decoder 101, a selected row of sub-decoders and the column address decoder/selector 104/105 selects the memory cells storing the accessed data bits, and the sub-arrays develop potential differences representative of the accessed data bits on the bit line pairs. The potential differences representative of the accessed data bits are transferred to the data buffer 106, and the data buffer 106 generates an output data signal representative of the accessed data bits.

While the write-in sequence and the read-out sequence are not requested, the semiconductor dynamic random access memory device repeats the data refresh as follows.

Figure 6:
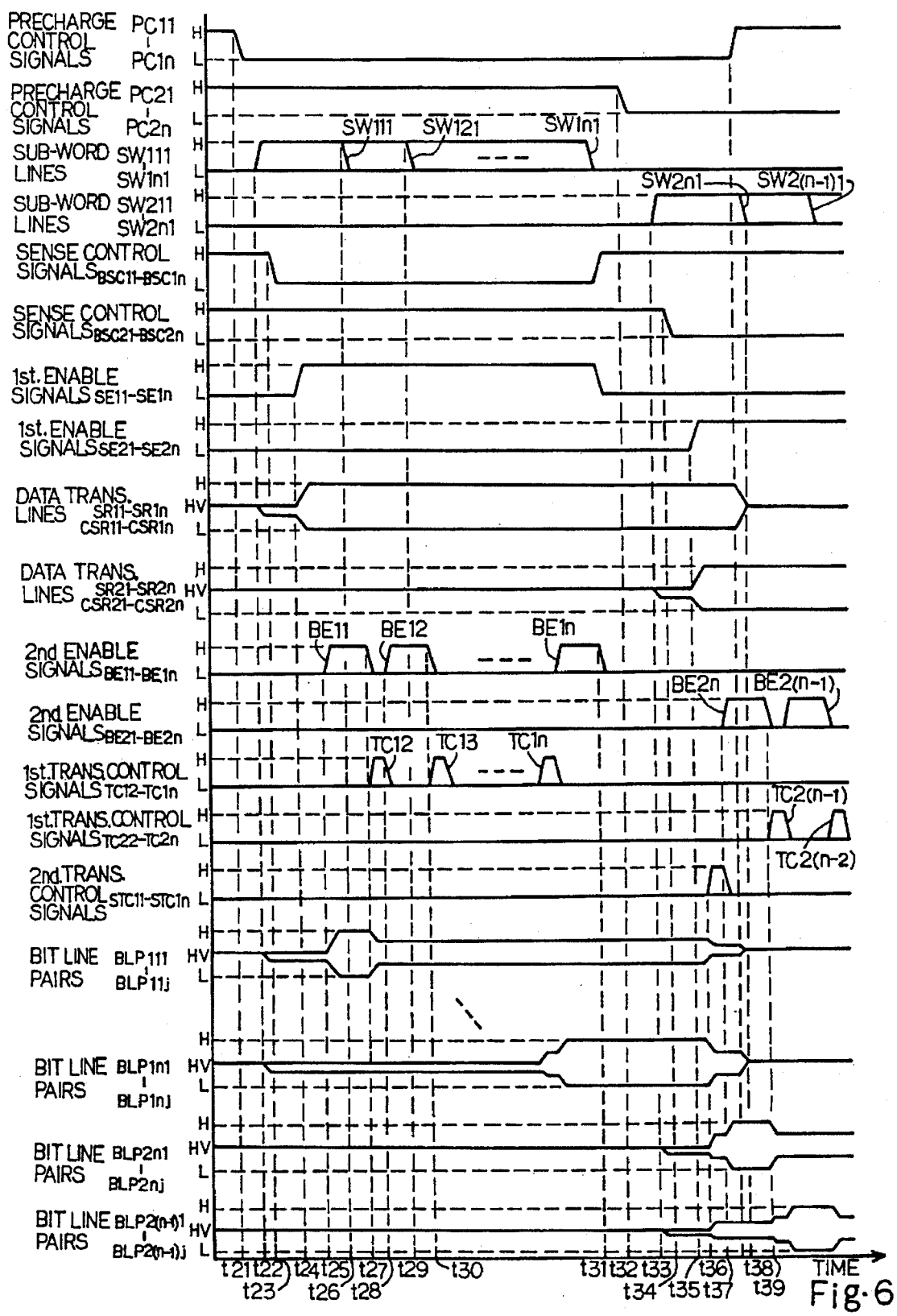
FIG. 6 is a timing chart showing a sequential data refresh carried in the semiconductor dynamic random access memory device.

FIG. 6 illustrates the data refresh on the rows of memory cell arrays MA11-MA1n and MA21-MA2n, and the data refresh is focused on these two rows of memory cell arrays MA11-MA1n and MA21-MA2n in the following description. The refresh controller 103 sequentially supplies the internal address signals to the main address decoder 101 and the sub-decoders, and requests the timing controller 102 to generate internal control signals necessary for the data refresh.

The precharge control signals PC11-PC1n start to decay from the active high level to the inactive low level at time t21, and all of the precharge circuits of the sub-arrays SAR11 to SAR1n electrically isolate the associated bit line pairs BLP111-BLP11j to BLP1n1-BLP1nj from the intermediate voltage line HV. The bit line pairs BLP111-BLP11j to BLP1n1-BLP1nj still maintain the intermediate voltage level HV. The equalizers of the sub-arrays SAR11 to SAR1n also respond to the precharge control signals PC11-PC1n, and isolate the power supply lines SAP11-SAP1n from the power supply lines SAN11-SAN1n, respectively. The equalizers keeps the power supply lines SAP and SAN at the intermediate voltage level HV.

The sub-word lines SW111 to SW1n1 start to rise from the inactive low level to the active high level at time t22, and electrically connect the storage capacitors of the memory cells MC11 to MC1j incorporated in the memory cell arrays MA11 to MA1n to the associated bit lines BLa. The bit lines BLa are slightly decayed or rise depending upon the data bits stored therein, and small potential differences take place on the bit line pairs BP111-BP11j to BP1n1-BP1nj. The small potential differences are propagated from the bit line pairs BLP111-BLP11j to BLP1n1-BLP1nj through the n-channel enhancement type switching transistors QN39 and Qn40 to the pairs of data transfer lines SR11/CSR11-SR1n/CSR1n. As a result, the small potential differences also take place on the pairs of data transfer lines SR11/CSR1-SR1n/CSR1n.

The sense control signals BSC11 to BSC1n start to decay from the active high level to the inactive low level at time t23, and cause the n-channel enhancement type switching transistors Qn39/Qn40 to turn off. The common drain nodes DN11/DN12 of the sense amplifiers SA11-SA1n are electrically isolated from the associated bit line pairs BLP111-BLP11j to BLP1n1-BLP1nj, and the common drain nodes DN11/DN12 are blocked from large parasitic capacitances coupled to the bit line pairs BLP111-BLP11j to BLP1n1-BLP1nj.

The enable signals SE11 to SE1n start to rise from the inactive low level to the active high level at time t24, and, accordingly, the complementary signals CSE11 to CSE1n are decayed to the low level. The enable signals SE11 to SE1n cause the n-channel enhancement type switching transistors Qn43 to turn on, and the complementary signals CSE11 to CSE1n also cause the p-channel enhancement type switching transistors Qp35 to turn on. The positive power voltage Vcc and the ground level are supplied to the power supply lines SAP11-SAP1n and the power supply lines SAN11-SAN1n, and all of the sense amplifier circuits of the sub-arrays SAR11 to SAR1n are concurrently activated. The sense amplifiers increase the small potential differences between the common drain nodes DN11 and DN12, and large potential differences are propagated through the pairs of data transfer lines SR11/CSR11 to SR1n/CSR1n to the bit line drivers of all the sub-arrays SAR11 to SAR1n.

The enable signal BE11 starts to rise from the inactive low level to the active high level at time t25, and the complementary signal CBE11 is concurrently decayed to the low level. The second controller BDC11 is activated, and supplies the positive power voltage Vcc and the ground level to the power supply lines LH11 and LG11. Then, the bit line drivers of the sub-array SAR11 are powered through the power supply lines LH11/LG11, and increase the small potential differences on the bit line pairs BLP111 to BLP11j. Thus, the data bits stored in the memory cells MC11 to MC1j of the memory cell array MA11 are increased to the restore level, and, accordingly, are refreshed.

The sub-word line SW111 starts to decay from the active high level to the inactive low level at time t26, and the data bits are restored in the memory cells MC11 to MC1j of the memory cell array MA11.

After the restore of the read-out data bits to the memory cells MC11 to MC1j of the memory cell array MA11, the enable signal BE11 is decayed at time t27, and the complementary signal CBE11 concurrently rises to the high level. As a result, the power supply lines LH11/LG11 are electrically isolated from the positive power voltage line Vcc and the ground voltage source.

The transfer signal TC12 starts to rise from the inactive low level to the active high level at time t27, and the complementary signal CTC12 is concurrently decayed to the low level. The n-channel enhancement type transfer transistor Qn45 and the p-channel enhancement type transfer transistor Qp37 both incorporated in the second controller BDC12 concurrently turn on, and the power supply line LH12 and the power supply line LG12 are equalized to the power supply line LH11 and the power supply line LG11, respectively.

The bit line drivers BD12 are powered through the power supply lines LH2/LG2, and are responsive to the large potential differences between the common drain nodes DN11 and DN12 so as to increase the small potential differences on the bit line pairs BLP121 to BLP12j to middle potential differences. Thus, the bit line drivers BD12 increase the small potential differences to the middle potential differences without power supply from the positive power voltage line Vcc and the ground voltage line.

The transfer signal TC12 starts to decay from the active high level to the inactive low level at time t28, and the complementary signal CTC12 is concurrently rises to the high level. The n-channel enhancement type transfer transistor Qn45 and the p-channel enhancement type transfer transistor Qp37 turn off, and the power supply lines LH12/LG12 are electrically isolated from the power supply lines LH11/LG11, respectively.

The second enable signal BE12 starts to rise from the inactive low level to the active high level at time t28, and the complementary signal CBE12 is concurrently decayed to the low level. The n-channel enhancement type switching transistor Qn44 and the p-channel enhancement type switching transistor Qp36 turn on, and the power supply lines LH12/LG12 are connected to the positive power voltage line Vcc and the ground voltage line, respectively. The bit line drivers are fully activated, and the middle potential differences on the bit line pairs BLP121 to BLP12j are increased to large potential differences. Thus, the data bits on the bit line pairs BLP121 to BLP12j are refreshed by the bit line drivers BD12, respectively.

The sub-word line SW121 is decayed at time t29, and the refreshed data bits are restored in the memory cells MC11 to MC1j of the memory cell array MA12.

The semiconductor dynamic random access memory device repeats the function from time t28 to time t30, and sequentially refreshes the data bits read out from the next memory cell array to the data bits read out from the memory cell array MA1n between time t30 and time t31.

All of the sub-word lines SW111 to SW1ni have been already recovered to the inactive level before time t31, and the precharge control signals PC21-PC2n are recovered to the inactive level at time t32. Then, the bit line pairs BLP211-BLP21j to BLP2n1-BLP2nj and the power supply lines SAP22/SAN22 are electrically isolated from the intermediate voltage line HV.

The sub-decoders SD21-SD2n change the sub-word lines SW211-SW2n1 to the active level at time t33. The memory cells MC11-MCij of the memory cell arrays MA21-MA2n generate small potential differences on the associated bit line pairs BLP211-BLP21j to BLP2n1-BLP2nj, and the small potential differences are propagated through the n-channel enhancement type switching transistors Qn39 and Qn40 to the common drain nodes DN11/DN12 of the sense amplifiers SA22. The sense control signals BSC21-BSC2n start to decay from the active high level to the inactive low level at time t34, and the common drain nodes DN11/DN12 of the sense amplifiers SA22 are electrically isolated from the associated bit line pairs BLP211-BLP21j to BLP2n1-BLP2nj.

The first enable signals SE21-SE2n start to rise from the inactive low level to the active high level at time t35, and the sense amplifiers SA22 increase the small potential differences between the common drain nodes DN11/DN12 to large potential differences. The large potential differences are propagated through the pairs of data transfer lines SR22/CSR22 to the bit line drivers BD22. The bit line drivers BD22 become ready for operation.

The second transfer control signals STC11-STC1n start to rise from the inactive low level to the active high level at time t36, and the n-channel enhancement type transfer transistors Qn46 and the p-channel enhancement type transfer transistors concurrently turn on. The residual electric charge accumulated in the bit line pairs BLP111-BLP11j to BLP1n1-BLP1nj flows through the power supply lines LH11/LG11-LH1n/LG1n to the power supply lines LH21/LG21-LH2n/LG2n, and the bit line drivers BD22 increase the small potential differences on the bit line pairs BLP211-BLP21j to BLP2n1-BLP2nj to middle potential differences.

The second transfer control signals STC11-STC1n are recovered to the inactive low level at time t37. The second enable signal BE2n starts to rise from the inactive low level to the active high level at time t37, and the bit line drivers BD2n of the sub-array SAR2n increase the middle potential differences on the bit line pairs BLP2n1-BLP2nj to large potential differences. The data bits thus refreshed are restored in the memory cells MC11-MC1j of the memory cell array MA2n, and the sub-word line SW2n1 is recovered to the inactive low level at time t38.

The second enable signal BE2n is recovered to the inactive level at time t39, and the first transfer control signal TC2(n–1) starts to rise to the active high level at time t39. The n-channel/p-channel enhancement type transfer transistors of the second controller BDC2(n–1) (not shown) turn on, and residual electric charge is transferred from the power supply lines LH2n/LG2n to the power supply lines LH2(n–1)/LG2(n–1).

In this way, the residual electric charge is successively transferred to the power supply lines, and the bit line drivers increase the middle potential differences to the large potential differences. Thus, the data bits are refreshed, and are restored in the memory cells MC11-MC1j of the memory cell arrays MA21-MA2n.

Though not shown in FIG. 6, the first precharge control signals PC11-PC1n are changed to the inactive low level again, and the sub-decoders SD11-SD1n select the sub-word lines next to the sub-word lines SW111-SW1n1. Small potential differences take place on the bit line pairs BLP111-BLP11j to BLP1n1-BLP1nj, and are transferred to the common drain nodes DN11-DN12. The sense amplifiers of the sub-arrays SAR11-SAR1n increase the small potential differences between the common drain nodes DN11 and DN12, and the large potential differences are propagated through the pairs of data transfer lines SR12/CSR12 to the bit line drivers of the sub-arrays SAR11-SAR1n. The second transfer control signals STC11-STC1n rise to the active high level, again, and the residual electric charge is transferred from the bit line pairs BLP211-BLP21j to BLP2n1-BLP2nj through the power supply lines LH21/LG21-LH2n/LG2n to the power supply lines LH11/LG11-LH1n/LH1n. The bit line drivers of the sub-arrays SAR11-SAR1n are partially activated, and increase the small potential differences on the bit line pairs BLP111-BLP11j to BLP1n1-BLP1nj. The precharge control signals PC21-PC2n are changed to the active high level, and the bit line pairs BLP211-BLP21j to BLP2n1-BLP2nj and the power supply lines SAP21-SAP2n/SAN21-SAN2n are equalized at the intermediate voltage level HV.

The second enable signals BE11-BE1n are periodically changed to the active high level so as to fully activate the bit line drivers SAR11-SAR1n. The first transfer control signals TC12-TC1n are also periodically changed to the active high level between the activations of the adjacent two bit line drivers, and the second controllers BDC12-BDC1n sequentially transfer the residual electric charge from the power supply lines LH11/LG11 to the power supply lines LH1n/LG1n.

Figure 1:
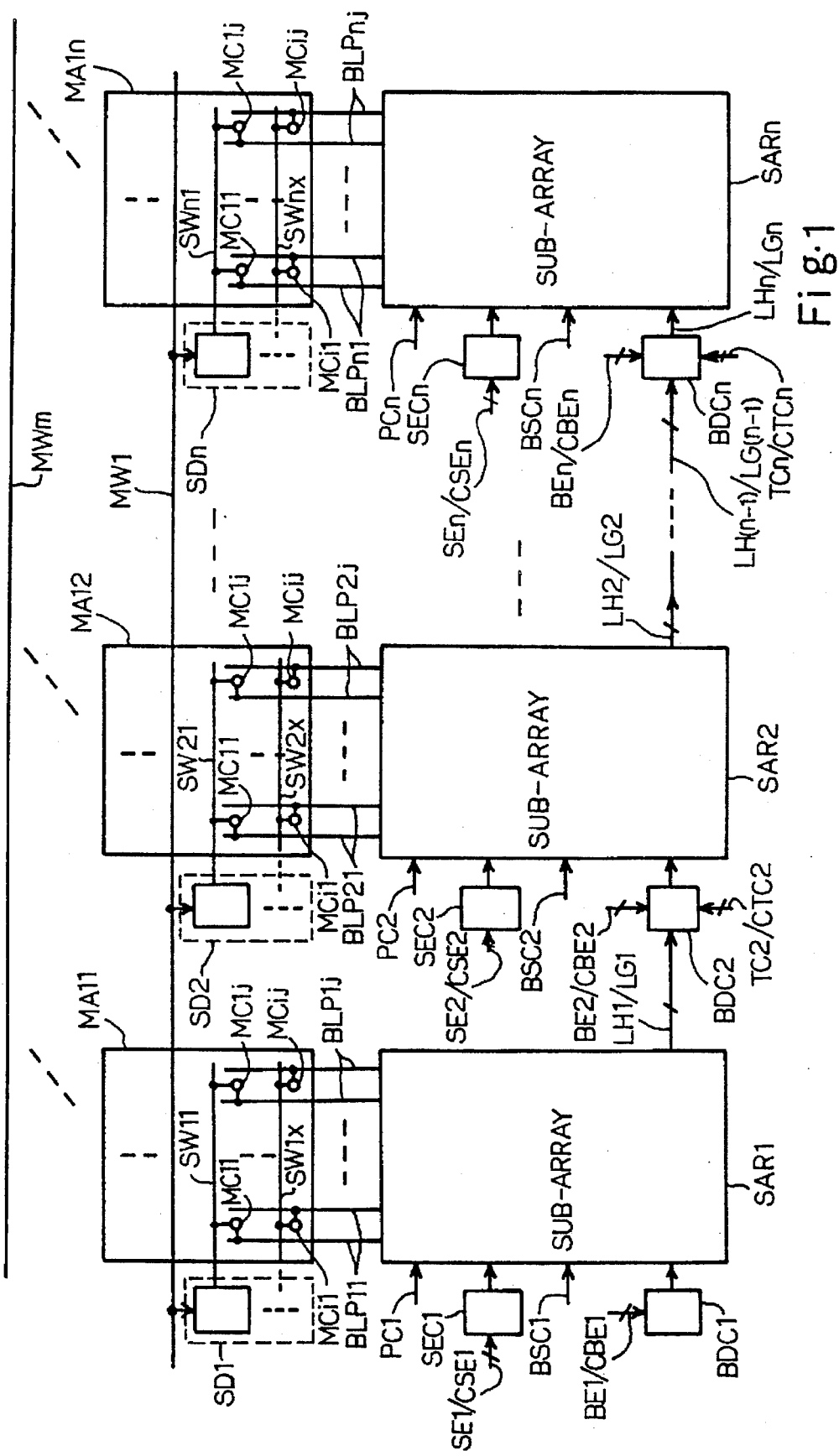
FIG. 1 is a block diagram showing the arrangement of the memory cell arrays incorporated in the prior art semiconductor dynamic random access memory device.
Figure 2:
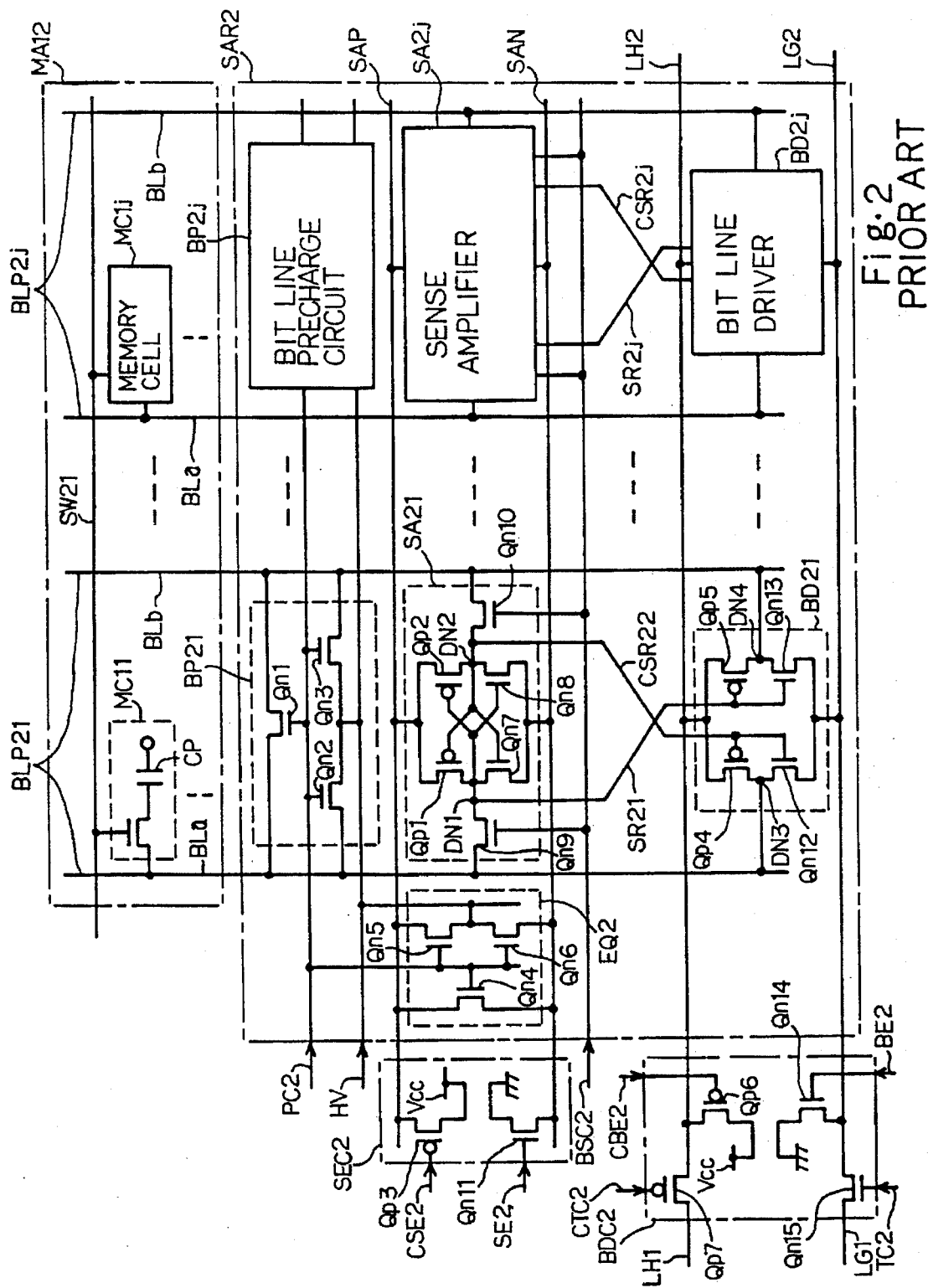
FIG. 2 is a circuit diagram showing the circuit configuration of the sub-array incorporated in the prior art semiconductor dynamic random access memory device.
Figure 3:
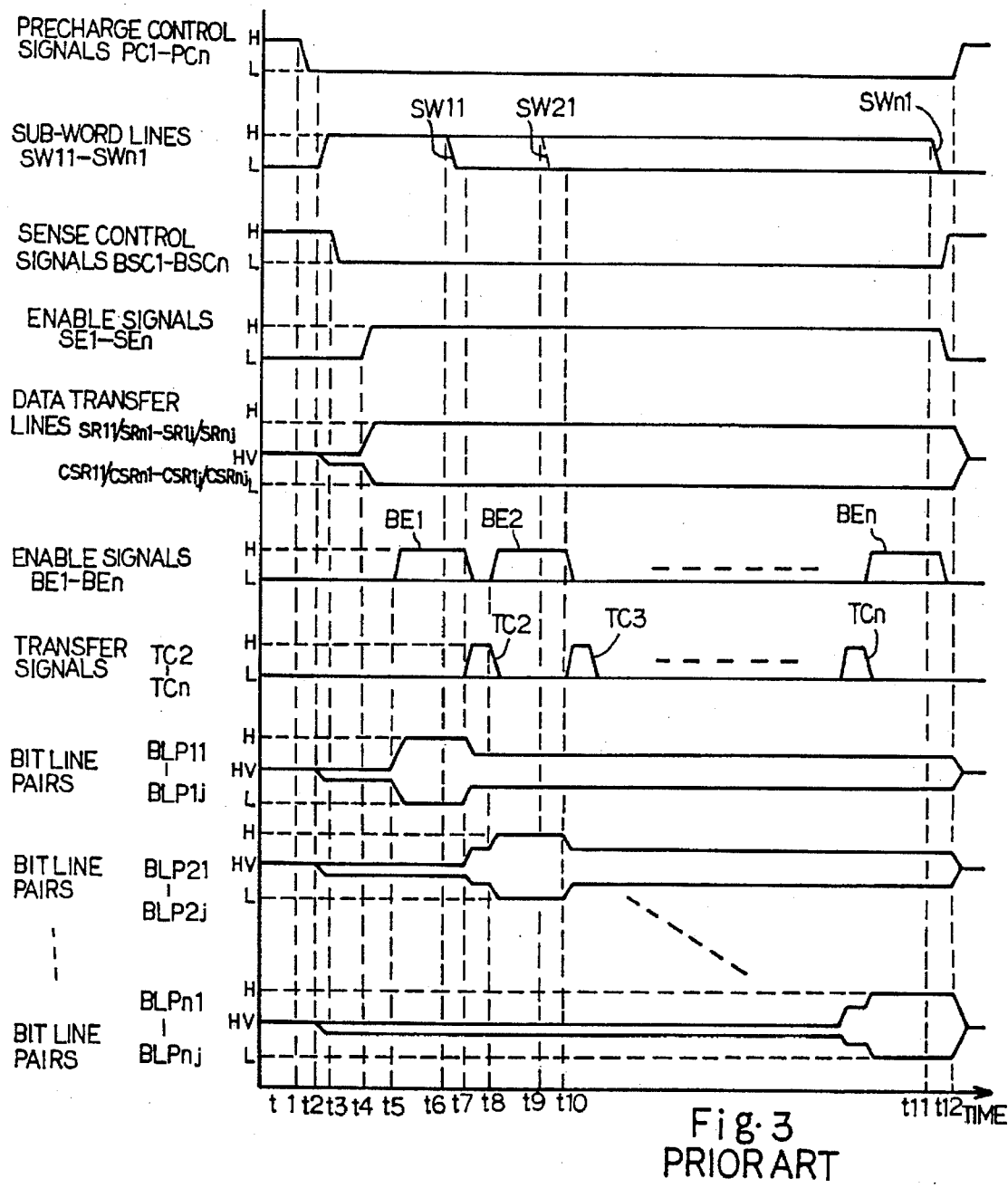
FIG. 3 is a timing chart showing the sequential data refresh for the row of memory cell arrays of the prior art semiconductor dynamic random access memory device.

Thus, the residual electric charge is recycled between the bit line pairs BLP111-BLP11j to BLP1n1-BLP1nj and the bit line pairs BLP211-BLP21j to BLP2n1-BLP2nj, and the power consumption is reduced to a half of that of the prior art semiconductor dynamic random access memory device shown in FIG. 1 and, accordingly, a quarter of that of a standard semiconductor dynamic random access memory device without the recycle paths for the residual electric charge.

In detail, when the semiconductor dynamic random access memory device starts the data refresh, all of the bit line pairs are equalized at the intermediate voltage level HV, i.e., Vcc/2. The sub-arrays SAR11 to SAR1n sequentially refresh the data bits on the bit line pairs BLP111-BLP11j to BLP1n1-BLP1nj, and each set of bit line pairs BLP121-BLP12j to BLP1n1-BLP1nj are equalized at 3 Vcc/4 and Vcc/4 to the adjacent bit line pairs BLP111-BLP11j to BLP1(n–1)-BLP1(n–1)j through the associated second controller. Upon completion of the data refresh for the memory cell array MA1n, the bit line pairs BLP1n1-BLP1nj are changed to Vcc and the ground level.

The residual electric charges on the bit line pairs BLP111-BLP11j to BLP1n1-BLP1nj are transferred through the transfer circuits TR11-TR1n to the bit line pairs BLP211-BLP21j to BLP2n1-BLP2nj, and the bit line pairs BLP111-BLP11j to BLP1n1-BLP1nj are equalized to the bit line pairs BLP211-BLP21j to BLP2n1-BLP2nj. As a result, the bit line pairs BLP2n1-BLP2nj are precharged to 3 Vcc/4 and Vcc/4, and the other bit line pairs are charged to 5 Vcc/8 and 3 Vcc/8.

Upon completion of the data refresh for the memory cell arrays MA21-MA2n, the bit line pairs BLP211-BLP21j are charged to Vcc and discharged to the ground level. The other bit line pairs BLP221-BLP22j to BLP2n1-BLP2nj are maintained at 13 Vcc/16 and 3 Vcc/16, and these potential differences are recycled to the bit line pairs BLP111-BLP11j to BLP1n1-BLP1nj.

The potential levels on the bit line pairs are getting closer to 7 Vcc/8 and Vcc/8 through the recycle between the bit line pairs BLP111-BLP11j to BLP1n1-BLP1nj and the bit line pairs BLP211-BLP21j to BLP2n1-BLP2nj, and, for this reason, the electric current consumption is reduced to a half of that of the prior art semiconductor dynamic random access memory device.

The first phase, the second phase, the third phase, the fourth phase, the fifth phase and the sixth phase are corresponding to time period until time t21, time period between time t21 and time t23, time period between time t24 and time t27, time period between time t27 and time t28, time period between time t28 and time t30 and time period between time t36 and time t37, respectively.

As will be appreciated from the foregoing description, the transfer circuits TR11-TR1n effectively reduce the electric power consumed by the semiconductor dynamic random access memory device according to the present invention in the data refresh.

Although the particular embodiment of the present invention has been shown and described, it will be obvious to those skilled in the art that various changes and modifications may be made without departing from the spirit and scope of the present invention.

For example, the semiconductor dynamic random access memory device may be fabricated on a plurality of semiconductor chips or fabricated on a single semiconductor chip together with other function blocks.

Moreover, the electric charge may be transferred from the power supply lines of the first row of sub-arrays to the last row of sub-arrays and, thereafter, return to the first row of sub-arrays.

What is claimed is:

1. A semiconductor dynamic random access memory device comprising:

a plurality of memory cell arrays divided into a plurality of memory cell array groups, each of said plurality of memory cell array including a plurality of dynamic random access memory cells arranged in rows and columns and respectively storing data bits in the form of electric charge;

a plurality of bit line pair groups respectively associated with said plurality of memory cell arrays, each of said plurality of bit line pair groups including a plurality of bit line pairs respectively coupled to the columns of dynamic random access memory cells of associated one of said plurality of memory cell arrays for propagating said data bits thereto and therefrom;

a plurality of main word lines respectively associated with said plurality of memory cell array groups, and selectively changed to an active level;

a plurality of sub-word line groups respectively associated with said plurality of memory cell array groups, each of said plurality of sub-word line groups including a plurality of sub-word lines respectively coupled to the rows of dynamic random access memory cells and selectively changed to an active level so as to transfer said data bits between a selected row of dynamic random access memory cells and the associated one of said plurality of bit line pair groups;

a plurality of sub-arrays respectively coupled through said plurality of bit line pair groups to said plurality of memory cell arrays, and divided into a plurality of sub-array groups respectively associated with said plurality of memory cell array groups, each of said plurality of sub-arrays including a plurality of precharge circuits respectively coupled to the plurality of bit line pairs of associated one of said plurality of bit line groups for charging said plurality of bit line pairs to an intermediate potential level in a first phase, a plurality of sense amplifiers respectively having pairs of sense nodes connectable to said plurality of bit line pairs in a second phase after said first phase when said data bits are read out from a selected one of said rows of dynamic random access memory cells for generating small potential differences on said plurality of bit line pairs, a first controlling means for causing said plurality of sense amplifiers to increase said small potential differences at said pairs of sense nodes to large potential differences in a third phase after said second phase, a plurality of bit line drivers respectively coupled to said plurality of bit line pairs and powered through a power supply means for stepwise increasing said small potential differences on said plurality of bit line pairs to large potential differences in response to said large potential differences at said pairs of sense nodes, and a second controlling means having a transfer sub-means for coupling said associated one of said plurality of bit line groups through said power supply means to another power supply means of another of said plurality of sub-arrays already increased small potential differences on associated bit line pairs to large potential differences and incorporated in the same sub-array group, thereby causing said plurality of bit line drivers to increase said small potential differences to middle potential differences in a fourth phase after said third phase, said second controlling means further having a power supply sub-means for coupling said power supply means to a source of power voltage, thereby increasing said middle potential differences to said large potential differences in a fifth phase after said fourth phase; and a charge transfer means coupled between said associated one of said plurality of bit line groups and another of said plurality of bit line groups associated with another of said plurality of memory cell groups for equalizing said another of said plurality of bit line groups to said associated one of said plurality of bit line groups in a sixth phase after said fifth phase when other small potential differences have already taken place on said another of said plurality of bit line groups.

2. The semiconductor dynamic random access memory device as set forth in claim 1, in which said plurality of precharge circuits charges said plurality of bit line pairs of said associated one of said plurality of bit line pair groups to said intermediate voltage level in a seventh phase after said sixth phase.

3. The semiconductor dynamic random access memory device as set forth in claim 1, in which the plurality of sub-arrays incorporated in one of said plurality of sub-array groups are intermittently activated so as to repeat the increase from said small potential differences to said middle potential differences in said fourth phase and the increase from said middle potential differences to said large potential differences in said fifth phase before said sixth phase.

4. The semiconductor dynamic random access memory device as set forth in claim 1, in which said source of power voltage supplies a positive power voltage and a ground voltage to said power supply means, and said intermediate voltage level is regulated to the mid point between said positive power voltage level and said ground voltage level.

* * * * *